US008677605B2

(12) United States Patent
Lim et al.

(10) Patent No.: US 8,677,605 B2
(45) Date of Patent: *Mar. 25, 2014

(54) METHOD FOR MANUFACTURING SENSOR UNIT

(75) Inventors: Sin-Heng Lim, Singapore (SG); Teck-Chai Goh, Singapore (SG)

(73) Assignee: Lite-On Singapore Pte. Ltd., Midview (SG)

( * ) Notice: Subject to any disclaimer, the term of this patent is extended or adjusted under 35 U.S.C. 154(b) by 113 days.

This patent is subject to a terminal disclaimer.

(21) Appl. No.: 13/189,090

(22) Filed: Jul. 22, 2011

(65) Prior Publication Data

US 2013/0019459 A1    Jan. 24, 2013

(51) Int. Cl.
*G01R 3/00*    (2006.01)

(52) U.S. Cl.
USPC ............ 29/595; 29/602.1; 29/832; 29/848; 29/856; 29/858; 250/216; 250/239

(58) Field of Classification Search
USPC ............ 29/592.1, 602.1, 832, 848, 849, 856, 29/858, 867; 250/216, 239
See application file for complete search history.

(56) References Cited

U.S. PATENT DOCUMENTS

| 5,291,038 | A * | 3/1994 | Hanamoto et al. ............... 257/82 |
| 6,740,862 | B2 * | 5/2004 | Paritsky et al. ............... 250/221 |
| 7,026,654 | B2 * | 4/2006 | Igaki et al. ..................... 257/80 |
| 7,309,855 | B2 * | 12/2007 | Nagasaka et al. ........ 250/231.14 |
| 7,842,957 | B2 * | 11/2010 | Goh et al. ....................... 257/82 |
| 8,146,247 | B2 * | 4/2012 | Lim et al. ....................... 29/848 |
| 8,232,541 | B2 * | 7/2012 | Wiese et al. ................. 250/551 |
| 8,324,602 | B2 * | 12/2012 | Wiese et al. ................. 250/551 |
| 2003/0059178 | A1 * | 3/2003 | Kobayashi et al. ............. 385/94 |

* cited by examiner

*Primary Examiner* — Paul D Kim
(74) *Attorney, Agent, or Firm* — Li & Cai Intellectual Property (USA) Office

(57) ABSTRACT

A method for manufacturing a sensor unit includes the steps of: Step 1 is providing a substrate having sensor unit areas. Each sensor unit area is partitioned into two individual circuit areas. A signal emitting device and a signal detecting device are respectively disposed on the two circuit areas. Step 2 is forming a packaging structure to cover the two circuit areas, the signal emitting device, the signal detecting device, and a cutting area between the two circuit areas using a mold. Step 3 is cutting the packaging structure along the cutting area to form a separation cut groove. Step 4 is assembling a separation member onto each sensor unit area. The separation member is disposed on the separation cut groove so that the signal emitting device and the signal detecting device on the same sensor unit area are isolated from each other.

12 Claims, 9 Drawing Sheets

METHOD FOR MANUFACTURING SENSOR UNIT

BACKGROUND OF THE INVENTION

1. Field of the Invention

The present invention relates to a method for manufacturing a sensor unit. In particular, the present invention relates to a method for manufacturing a proximity sensor.

2. Description of Related Art

Depending on the development of the electronic product, the electronic product is controlled by the input devices such as a key, a keypad, a tracking ball, or a touch panel screen. Recently, the touch panel screen has been widely used in electronic applications. The touch panel screen mainly includes a touch panel which has a transparent panel with a sensitive surface to cover the displaying area of the screen. Users can select the items or move the cursor by using a finger or a touch pen on the touch panel screen so that the electronic device is controlled by the touch signals from the touch panel screen. For switching the touch panel screen, an IR proximity sensor is widely used in mobile communication devices for detecting the face of users so as to control the on/off of the touch panel screen of the mobile communication device.

The proximity sensor is widely used in mobile devices. For example, when the user is away from the screen, the screen will be locked or turned off so as to save the power consuming. On the other hand, when the head of the user is close to the device, the function of screen will be locked to avoid mis-touch issues and problems. Furthermore, a long-range proximity sensor can be used for detecting whether there is an object within the distance of about 20 to 80 cm. Therefore, the long-range proximity sensor can be used in a display device of a desktop computer. When the user leaves the computer, the sensor can detect the motion of the user so as to control the system to turn off the display of the computer.

The proximity sensor has an emitter and a detector. For shielding the crosstalk of signals, the emitter and the detector of the traditional proximity sensor are packaged with packaging materials and a metal frame is assembled with the packaging structure to form an isolating barrier to minimize interference by or among signals. However, the final packaging structure has to generally form locking structures to properly assemble the metal frame. The manufacturing processes and the structures of the metal frame are highly complex. Besides, glue is used on the packaging structure for fixing the metal frame on the packaging structure. The glue cannot be controlled easily. For example, an excess of the glue may over-flow on the structure. On the other hand, less glue may result in the disassembling or relative movement of the metal frame and the packaging structure, which causes the crosstalk of signals.

On the other hand, in small-sized devices, the precise assembling of the metal frame and the packaging structure is necessary for isolating signals. Thus, the assembling processes are more and more complex, thereby complicating assembly processes and the manufacturing yields are likely to decline.

SUMMARY OF THE INVENTION

One primary objective of the instant disclosure is to provide a method for manufacturing a sensor unit. For this, a mold is used in a molding step for forming the packaging structure which is used for protecting the emitter and detector, and a separation member is assembled with the packaging structure. Thus, the isolation structure with the stable final structure and the high precision structure is formed.

The instant disclosure provides a method for manufacturing a sensor unit. The method includes the steps of:

Step 1 is providing a substrate having a plurality of sensor unit areas. Each of the sensor unit area is partitioned into at least two individual circuit areas. A signal emitting device and a signal detecting device are respectively disposed on the two circuit areas of the sensor unit area on surface and in interior of the substrate.

Step 2 is forming a packaging structure on the substrate to cover the two circuit areas of the sensor unit area, the signal emitting device, the signal detecting device, and a cutting area defined between the two circuit areas using a mold.

Step 3 is cutting the packaging structure along the cutting area to form a separation cut groove between the two circuit areas so that the substrate is exposed from the separation cut groove.

Step 4 is assembling a separation member onto each of the sensor unit areas. The separation member is disposed on the separation cut groove so that the signal emitting device and the signal detecting device on the same sensor unit area are isolated from each other.

The process of the method provided by the instant disclosure is simple and optimized; therefore, the manufacturing cost can be reduced. By assembling the separation member with the packaging structure of the sensor unit area, the signals of the emitter and the detector can be efficiently isolated. The packaging and isolation structure of the instant disclosure has value properties, especially high precision and efficient signal-shielding. Thus, the sensor unit of the instant disclosure has high reliability.

For further understanding of the present invention, reference is made to the following detailed description illustrating the embodiments and examples of the present invention. The description is for illustrative purpose only and is not intended to limit the scope of the claims

DETAILED DESCRIPTION OF THE PREFERRED EMBODIMENTS

Figure 1:
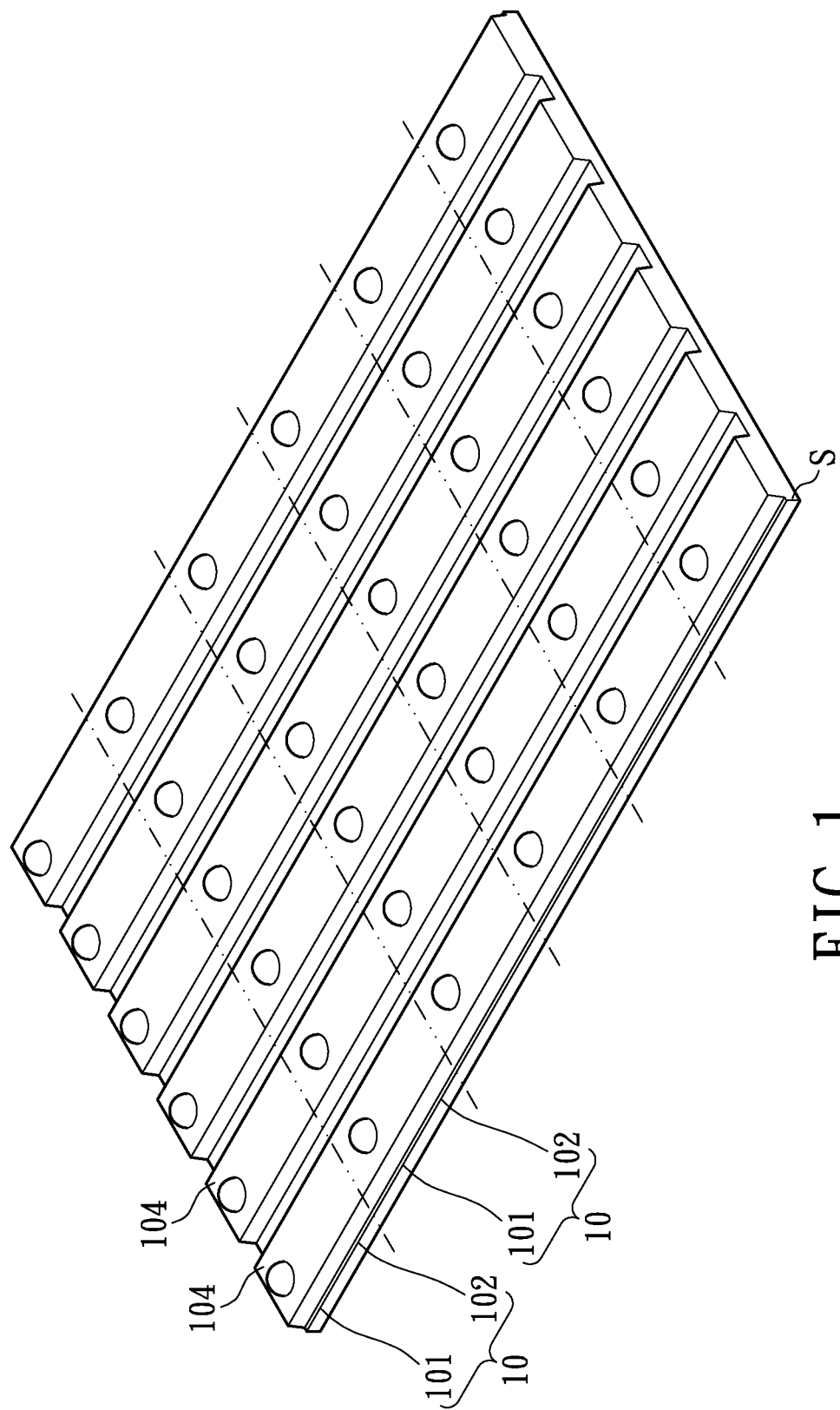
FIG. 1 shows the packaging structures formed on the substrate of the instant disclosure.
Figure 2:
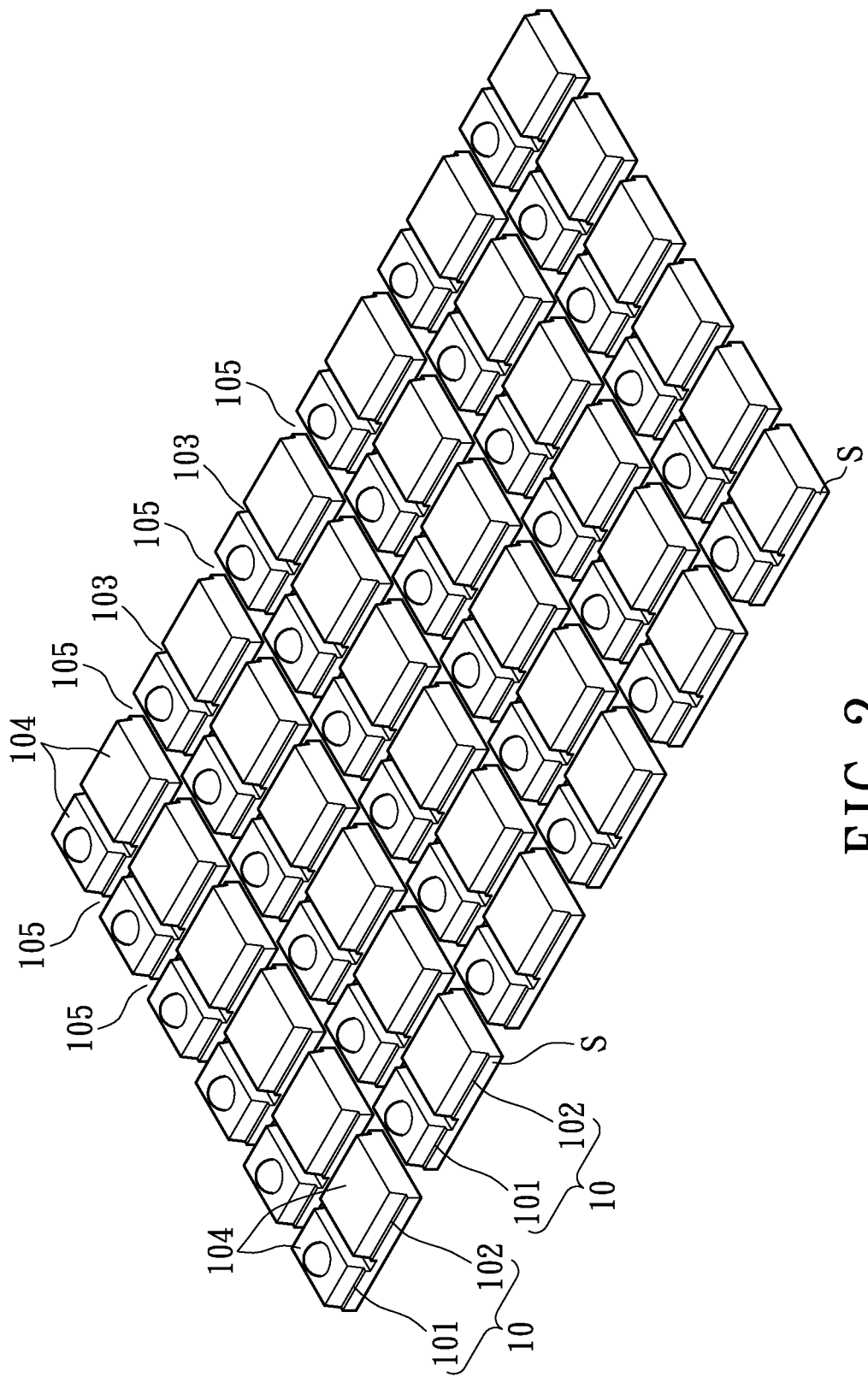
FIG. 2 shows that the sensor unit areas are cut according to the instant disclosure.
Figure 3:
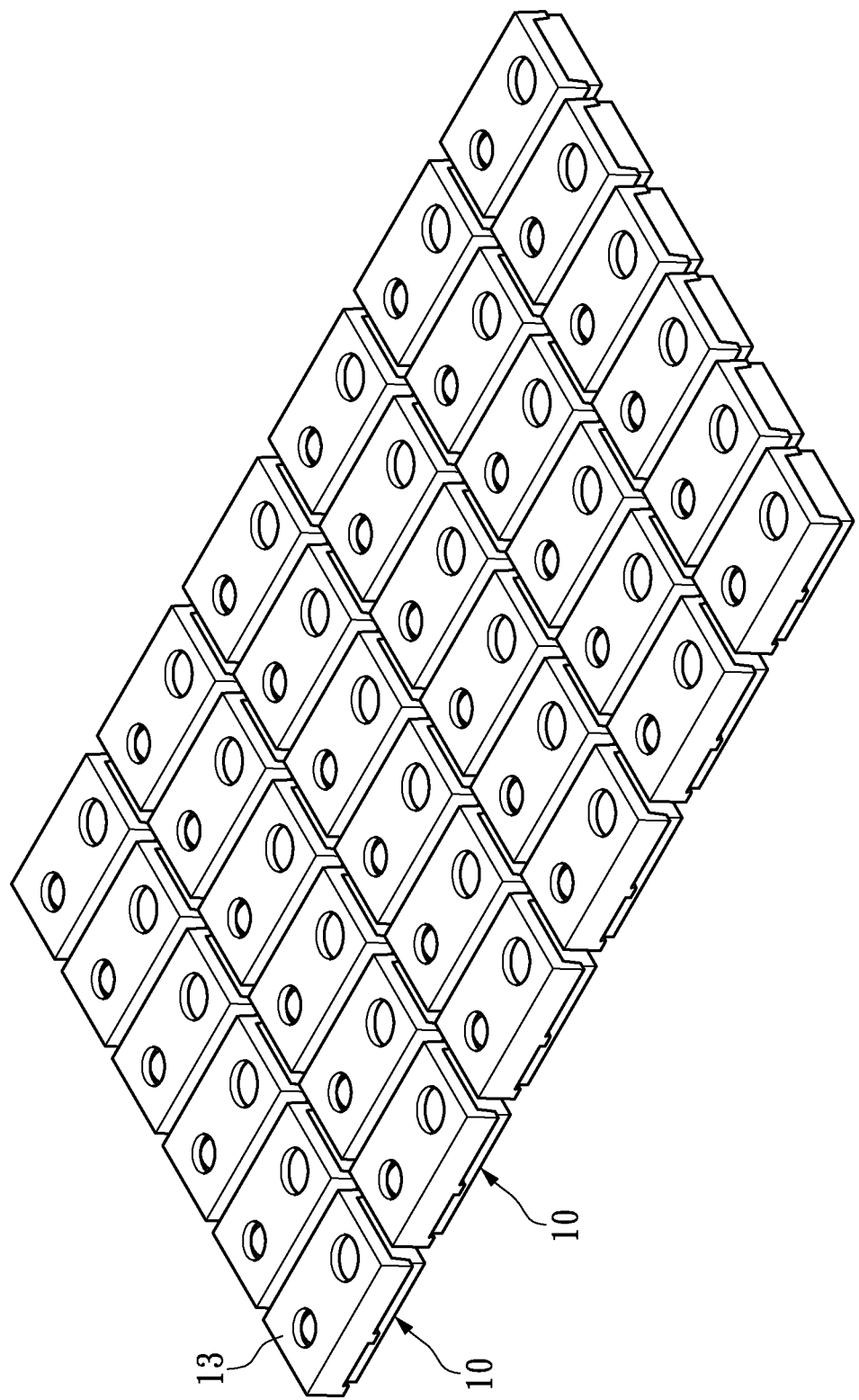
FIG. 3 shows that the separation member is assembled on the individual sensor unit area according to the instant disclosure.
Figure 4:
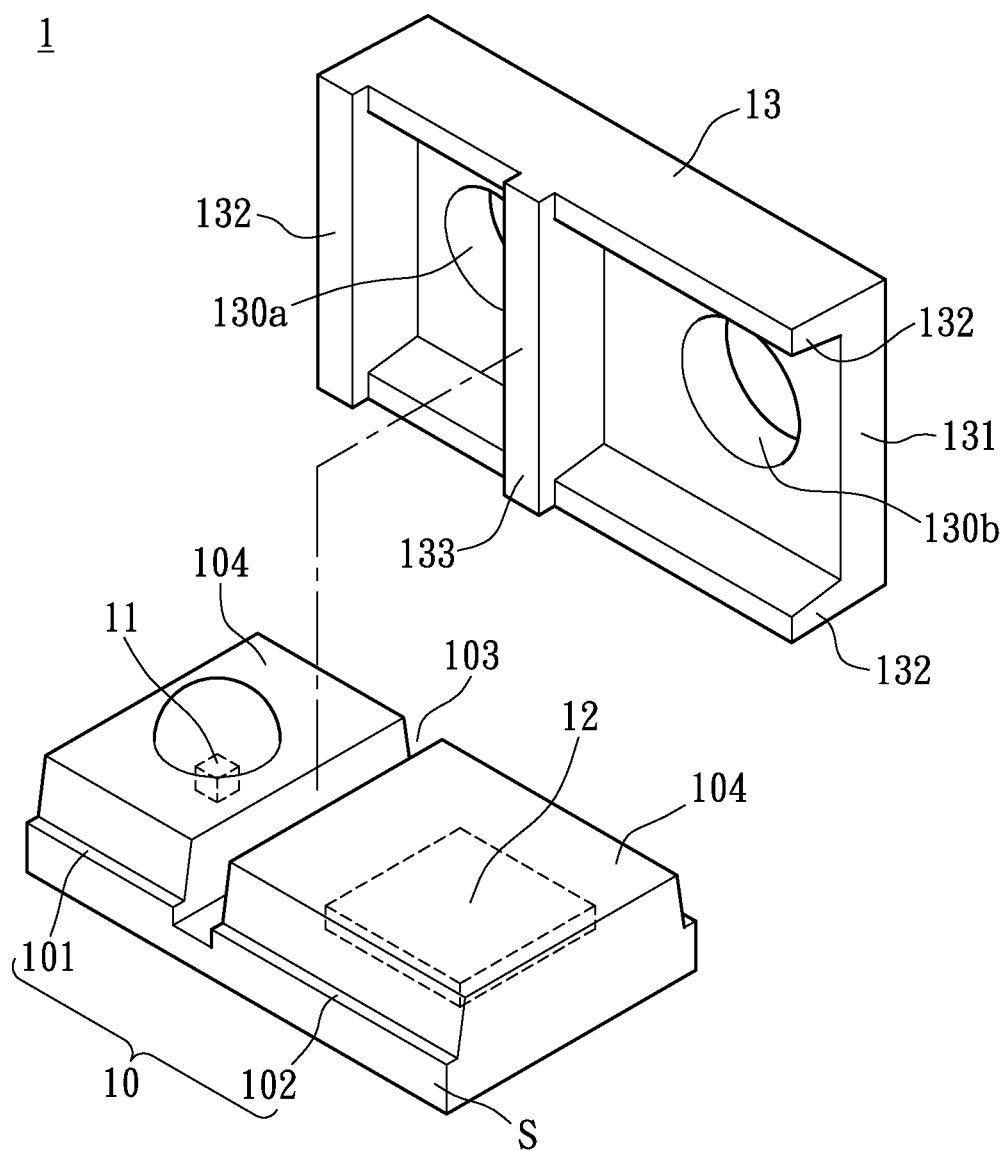
FIG. 4 shows the exploded diagram of the single sensor unit according to the instant disclosure.

Please refer to FIGS. 1 to 3; the present invention provides a method for manufacturing a sensor unit 1 (shown in FIG. 4).

One molding step with an assembling step of a separation member 13 is provided in the manufacturing method to package and to isolate the elements of the sensor unit 1. The manufacturing cost is decreased and the assembling problems of the traditional sensor are further resolved. The manufacturing method has the following steps.

Figure 5:
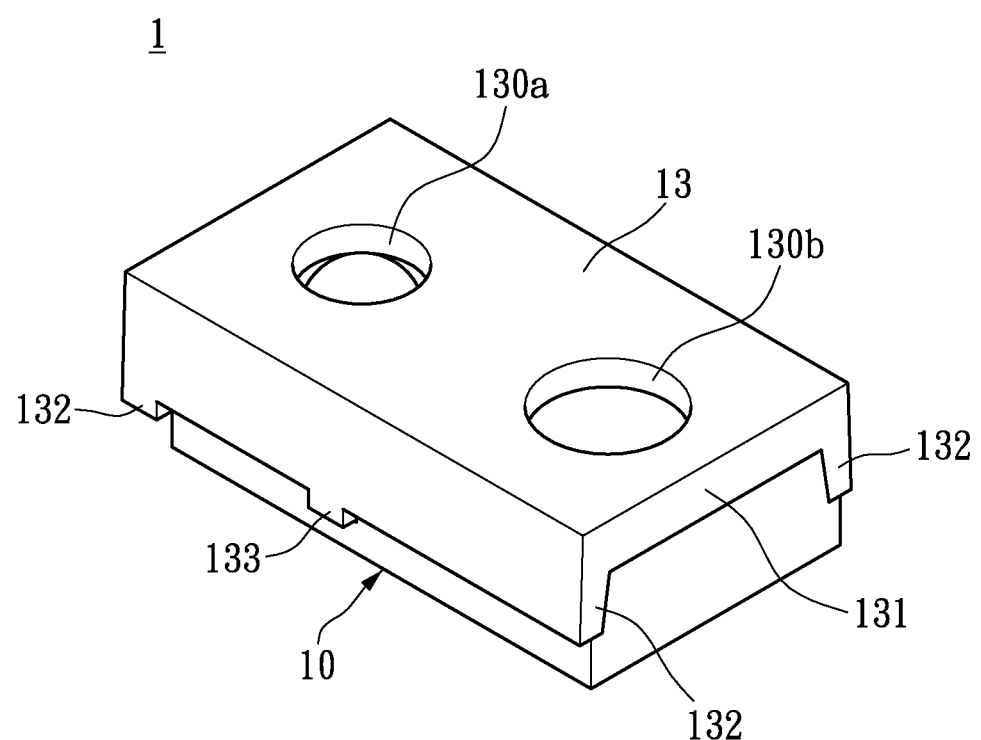
FIG. 5 shows the structural diagram of the single sensor unit according to the instant disclosure.
Figure 6:
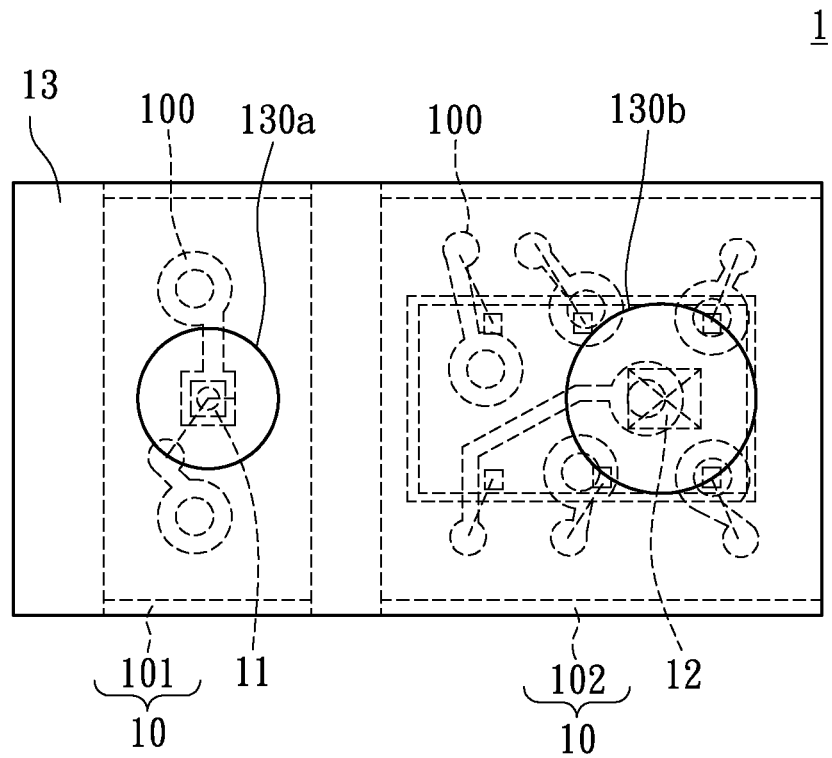
FIG. 6 shows the top view of the single sensor unit according to the instant disclosure

Step 1 of the present invention is providing a substrate "S" having a plurality of sensor unit areas 10 thereon. As shown in FIG. 1, the substrate "S" of the exemplary embodiment has a sensor array with 6×6 sensor unit areas 10 (i.e., a sensor panel) and each sensor unit area 10 can be manufactured as one single sensor unit 1 (as shown in FIGS. 4 and 5). Each sensor unit area 10 is partitioned into two individual circuit areas 101, 102 (or more than two circuit areas) and the circuit areas 101, 102 are formed on a surface of the substrate "S" and in the interior of the substrate "S". Please refer to FIG. 4; for a manufactured sensor unit 1, a signal emitting device 11 thereof and a signal detecting device 12 thereof are respectively disposed on the circuit areas 101, 102 by, for example, die-attaching and wire-bonding methods. Therefore, the signal emitting device 11 and the signal detecting device 12 are electrically connected with the circuit 100 in the circuit areas 101, 102, as shown in FIG. 6. In the exemplary embodiment, the sensor unit 1 can be a proximity sensor unit, and the signal emitting device 11 and the signal detecting device 12 are respectively an emitter and a detector. In detail, the signal emitting device 11 (i.e., emitter) and the signal detecting device 12 (i.e., detector) are respectively mounted on the two circuit areas 101, 102 of the sensor unit area 10 by die-attaching method, and the emitter and the detector are electrically connected to the circuit 100 of corresponding circuit area 101 or 102 by wires.

Step 2 is forming a packaging structure 104 on the substrate "S" via a mold. In this step, a packaging material is formed on the substrate "S" to cover the signal emitting device 11 and the signal detecting device 12 on the substrate "S". Please refer to FIG. 1 again; a mold (not shown) is used in Step 2 to perform a molding step so as to cover the circuit areas 101, 102, the signal emitting device 11 and the signal detecting device 112 by a cured packaging material. On the other hand, a cutting area is defined between the circuit areas 101, 102. Furthermore, the properties of the packaging material used in this step have to meet the requirements of the operation of the sensor unit 1. For example, the light signals emitted from the signal emitting device 11 have to pass through the packaging structure 104. Similarly, the signals have to pass through the packaging structure 104 so that the signals can be detected by the signal detecting device 12. In a practical detail, the signal detecting device 12 can be an integrated ambient and proximity sensor; therefore the packaging material has transmission properties, such as clear molded materials, for visible light to provide for transfer of visible light signals. Alternatively, the signal detecting device 12 can be an IR proximity sensor; therefore the packaging material has transmission property of infrared-range radiation. In other words, the material of the packaging structure 104 is not restricted, but the transmission property of the material has to meet the requirement of the signals transmission operations so as to maintain the signal processing quality. In addition, the packaging structure 104 further has convex portion, i.e., a lens portion corresponding to the signal emitting device 11 for efficiently radiating the signals emitted from the signal emitting device 11.

Step 3 is removing the mold and providing a cutting step. After the packaging material of the packaging structure 104 is cured, the mold can be removed from the substrate "S" for performing the cutting step. Please refer to FIG. 2; the cutting step is provided for cutting the packaging structure 104 along the peripheral of each sensor unit area 10 to form the cut grooves 105 by cutting tools, for example, saws or laser. In other words, the cut grooves 105 surround the circuit areas 101, 102 of each sensor unit area 10 so as to from individual sensor unit area 10 from the original sensor panel. Next, the cutting step is provided for cutting the packaging structure 104 along the cutting area between the circuit areas 101, 102 to form the separation cut groove 103, and the substrate "S" is exposed from the separation cut groove 103. Two ends of the separation cut groove 103 are connected to the cut groove 105, in this exemplary drawing, a square-sided and cornered "8-shape". Therefore, the signal emitting device 11 of the circuit areas 101 is isolated from the signal detecting device 12 of the circuit areas 102 by the separation cut groove 103.

For the reason of better isolation, the depth of the separation cut groove 103 is larger than the thickness of the packaging structure 104 so as to expose the substrate "S". In the exemplary embodiment, the separation cut groove 103 extends into the substrate "S". In other words, the cutting step is provided for removing the material of the packaging structure 104 and further removing the material of substrate "S" downwardly to form the deep cut groove 103. In the exemplary embodiment, the substrate "S" has removed about 0.2 mm from the surface thereof.

Step 4 is assembling a separation member 13 onto each of the sensor unit areas 10 and the separation member 13 is fixed in the separation cut groove 103. Please refer to FIG. 3; a plurality of separation members 13 is provided in coordination with the packaging structure 104 so that the separation members 13 can be fixedly secured with the separation cut groove 103 to serve as the isolation shield. Because the signal emitting unit (i.e., the combination of the circuit area 101 and the signal emitting device 11) is isolated from the signal detecting unit (i.e., the combination of circuit area 102 and the signal detecting device 12) by the separation cut groove 103, the assembled separation member 13 is applied for isolating the signal emitting device 11 and the signal detecting device 12 so that the crosstalk of the signal emitting device 11 and the signal detecting device 12 is avoided.

The separation member 13, preferably, is made of materials having property of non-transmission of infrared-range radiation so that the separation member 13 performs and serves as an IR barrier. In the exemplary embodiment, the separation member 13 can be made of plastic materials with non-transmission of infrared-range radiation by the injection method. As shown in FIGS. 4 and 5, the separation member 13 includes a top packaging plate 131, a separation plate 133 and a plurality of side packaging plates 132. The top packaging plate 131 has an emitting hole 130a corresponding to the signal emitting device 11 and a detecting hole 130b corresponding to the signal detecting device 12. After assembling the separation member 13, the top packaging plate 131 corresponds to the top surface of the packaging structure 104, and the signal emitting device 11 and the signal detecting device 12 are respectively exposed form the emitting hole 130a and the detecting hole 130b. Therefore, the signals can pass through emitting hole 130a and the detecting hole 130b. The side packaging plates 132 can be assembled onto the peripheral of the packaging structure 104. Most important, the separation plate 133 is fixed or attached onto the separation cut groove 103 to isolate the signal emitting device 11 and the signal detecting device 12 of one individual sensor unit area 10.

Figure 7:
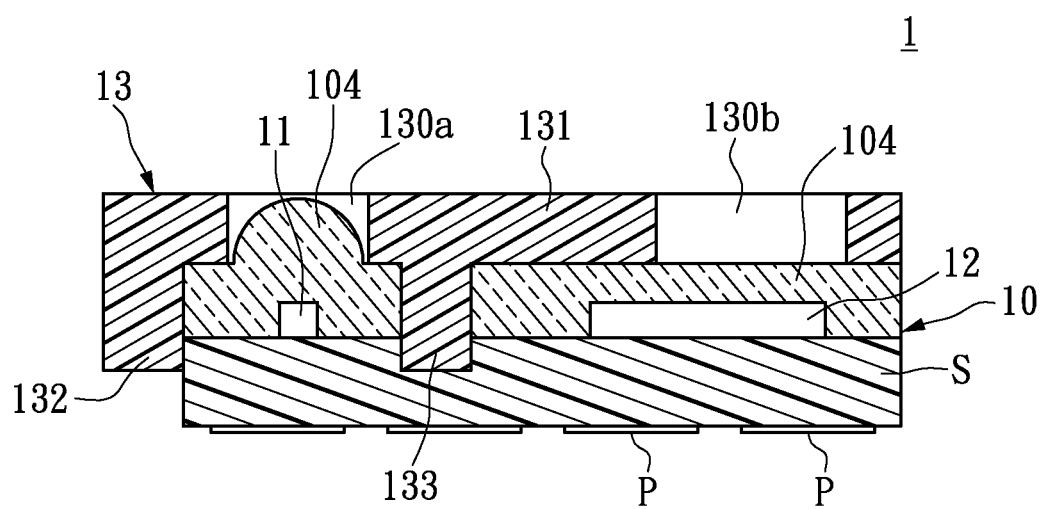
FIG. 7 shows the side view of the single sensor unit according to the instant disclosure.

In light of the roughness of the surface of the substrate "S", the bottom of the separation plate 133 may not precisely contact the surface of the substrate "S". The above-mentioned imprecise contact will cause the crosstalk of the signal emitting device 11 and the signal detecting device 12. Therefore, the separation cut groove 103 extends into the substrate "S" in step 3 so that the separation plate 133 can be assembled inside the substrate "S". As shown in FIG. 7, the separation plate 133 extends into the substrate with about 0.2 mm (i.e., the depth of the separation cut grooves 103 in the substrate "S"). Therefore, the extended portion of the separation plate 133 is used for improving the isolation of the signal emitting device 11 and the signal detecting device 12; thus a multiplicity of difficulties are addressed by this disclosure.

Please refer to FIGS. 4, 5, 7; the sensor unit 1 is formed after the above-mentioned steps. The sensor unit 1 has a substrate "S" having two individual circuit areas 101, 102 thereon. The signal emitting device 11 and the signal detecting device 12 are respectively disposed on the two circuit areas 101, 102 and electrically connected with the circuit 100 of the two circuit areas 101, 102 by wire-bonding, as shown in FIG. 6. The packaging structure 104 is disposed on the substrate "S" and covers the signal emitting device 11 and the signal detecting device 12. The separation cut groove 103 is formed between the signal emitting device 11 and the signal detecting device 12. Moreover, the separation member 13 is made of resins or plastics with non-transmission property of infrared-range radiation. The separation member 13 can be assembled with the packaging structure 104; thus, the crosstalk problem of signals of the signal emitting device 11 and the signal detecting device 12 is resolved. In further detail, the separation member 13 is fixedly secured or attached with the packaging structure 104 and they may not be disassembled with each other. Due to the stable assembling of the separation member 13 and the packaging structure 104, the isolation function provided by the separation member 13 may be reliably remained. Please note that at least one side of the packaging structure 104 is exposed from the separation member 13. In other words, at least one side of the packaging structure 104 does not be covered by the side packaging plates 132. The type of the sensor unit 1 may be applied for a situation that there is no external source noise. In addition, because the side of the packaging structure 104 is not covered, the space of the sensor unit 1 may be saved and more devices of another function may be added thereinside.

On the other hand, the separation plate 133 of the separation member 13 extends into the substrate "S" so that the signals of the signal emitting device 11 and the signals of the signal detecting device 12 are improved by being affirmatively isolated from each other. Moreover, the separation member 13 and the packaging structure 104 are reliably fixed to each other so that the sensor unit 1 has improved reliability when the sensor unit 1 is operated in high temperature application. On the other hand, the bottom surface which is opposite to the mounting surface of the signal emitting device 11 and the signal detecting device 12 has a plurality of connection structures, such as conductive pads "P" thereon, and the signal emitting device 11 and the signal detecting device 12 can be electrically to external power by the conductive pads "P" to get electric power and controlling signals.

Alternatively, the mold used in the Step 2 can be applied again to perform a second molding step. In other words, the mold is used in coordination with the packaging structure 104 to fill suitable resin or plastic into the separation cut groove 103 so as to form the above-mentioned separation member 13. Because signal emitting unit (i.e., the combination of the circuit area 101 and the signal emitting device 11) is isolated from the signal detecting unit (i.e., the combination of circuit area 102 and the signal detecting device 12) by the separation cut groove 103, the cured separation member 13 is applied for isolating the signal emitting device 11 and the signal detecting device 12 so that the crosstalk of the signal emitting device 11 and the signal detecting device 12 is avoided.

Figure 8:
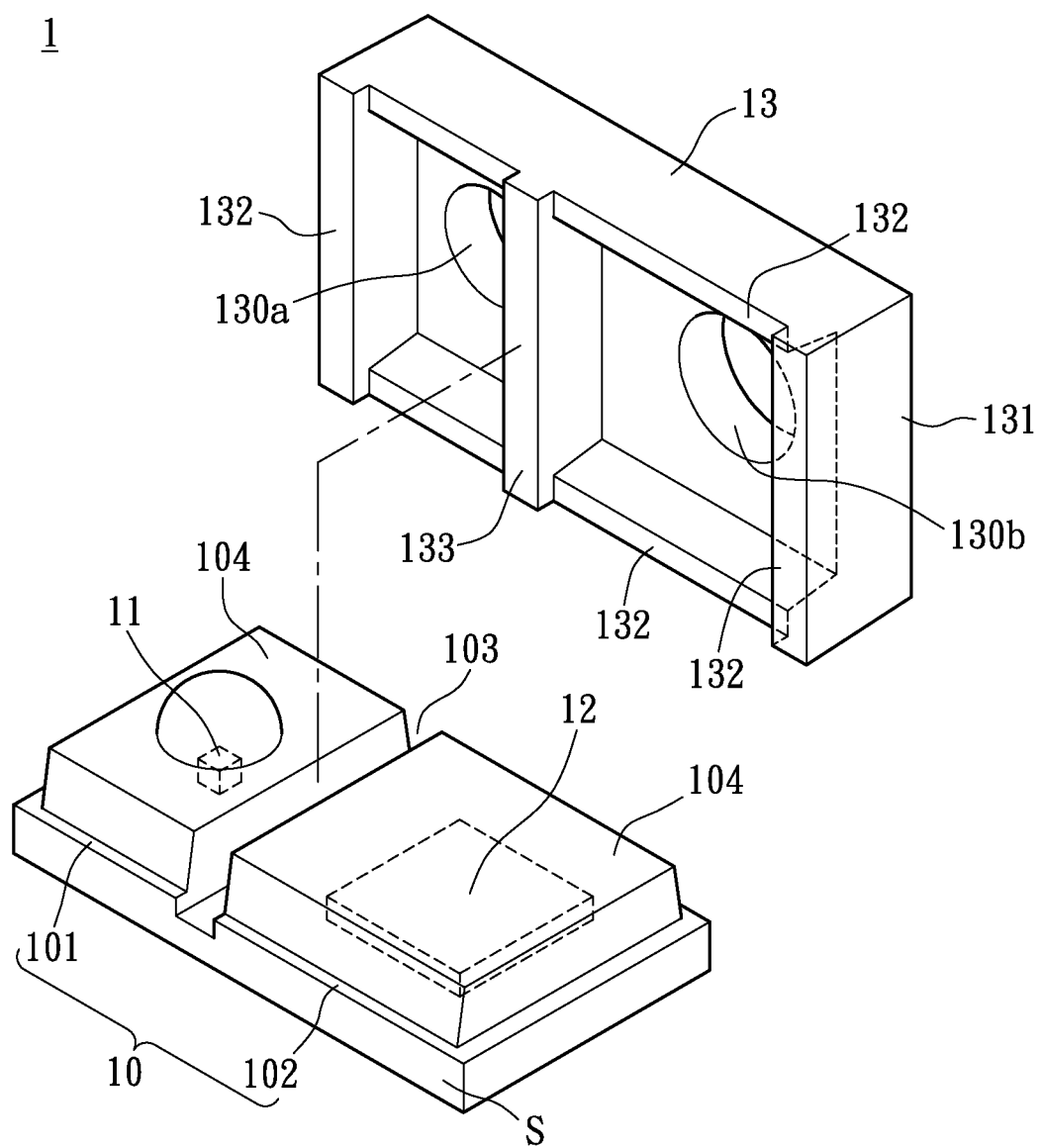
FIG. 8 shows the exploded diagram of the second embodiment of the single sensor unit according to the instant disclosure.
Figure 9:
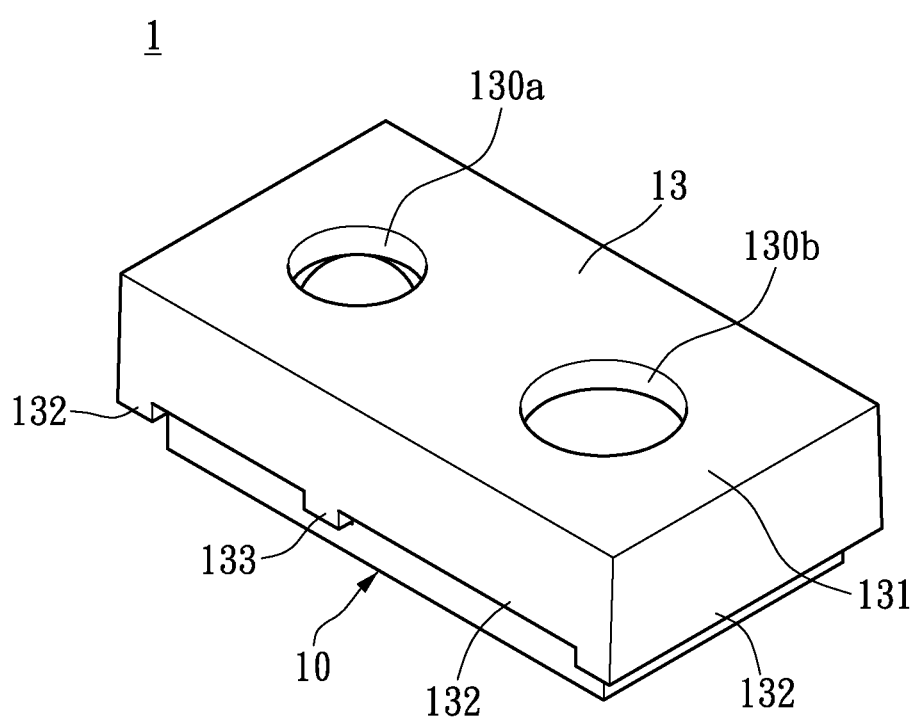
FIG. 9 shows the structural diagram of the second embodiment of the single sensor unit according to the instant disclosure.
Figure 10:
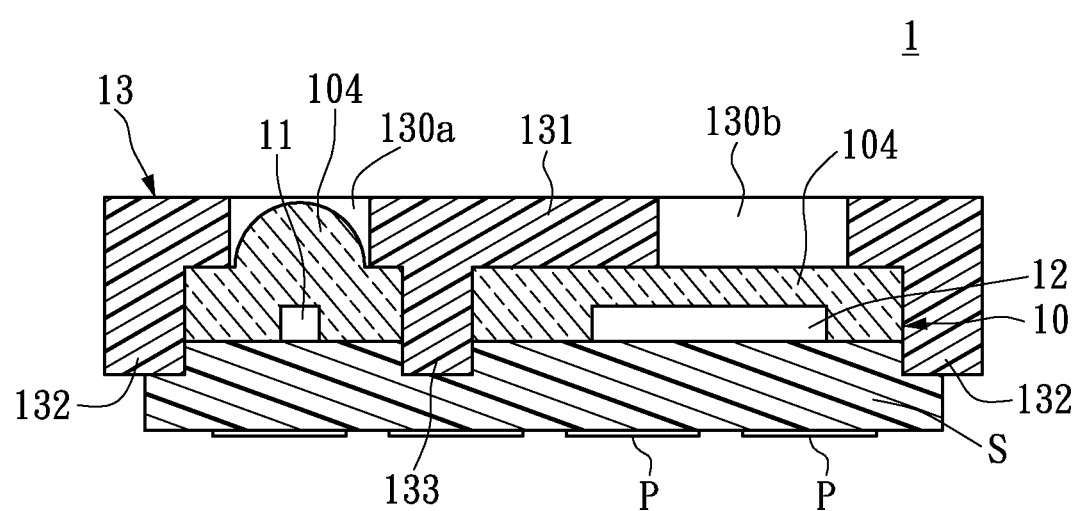
FIG. 10 shows the side view of the second embodiment of the single sensor unit according to the instant disclosure.

Please refer to FIGS. 8, 9, 10; the second embodiment of the sensor unit 1 is shown. In the exemplary embodiment, the packaging structure 104 is fully covered by the separation member 13. In structural detail, the sides of the packaging structure 104 are completely covered by the side packaging plates 132 of the separation member 13 so that the device, especially detecting device 12 is isolated from external light noise. On the other hand, comparing to the embodiment shown in FIGS. 4, 5 and 7, the space of the sensor unit 1 may be limited.

The description above only illustrates specific embodiments and examples of the present invention. The present invention should therefore cover various modifications and variations made to the herein-described structure and operations of the present invention, which falls within the scope of the present invention as defined in the following appended claims.

What is claimed is:

1. A method for manufacturing a sensor unit, comprising the following steps:
   providing a substrate having a plurality of sensor unit areas,
      wherein each of the sensor unit area is partitioned into at least two individual circuit areas,
      wherein a signal emitting device and a signal detecting device are respectively disposed on the at least two individual circuit areas of the sensor unit area on surface and in interior of the substrate;
   forming a packaging structure on the substrate to cover the at least two individual circuit areas of the sensor unit area, the signal emitting device, the signal detecting device, and a cutting area defined between the at least two individual circuit areas using a mold;
   cutting the packaging structure along the cutting area to form a separation cut groove between the at least two individual circuit areas so that the substrate is exposed from the separation cut groove; and
   assembling a separation member onto each of the sensor unit areas,
      wherein the separation member is disposed on the separation cut groove so that the signal emitting device and the signal detecting device on the same sensor unit area are isolated from each other.

2. The method as claimed in claim 1, wherein in the step of cutting the packaging structure, the method further includes a step of separating the plurality of sensor unit areas as individual sensor unit areas.

3. The method as claimed in claim 2, wherein in the step of assembling a separation member, the separation member includes a top packaging plate, a separation plate and a plurality of side packaging plates, the top packaging plate has an emitting hole corresponding to the signal emitting device and a detecting hole corresponding to the signal detecting device, the separation plate is fixedly secured with the separation cut groove.

4. The method as claimed in claim 3, wherein the separation member is formed of plastic materials by an injection method.

5. The method as claimed in claim 4, wherein the separation member is formed of plastic materials with non-transmission of infrared-range radiation by the injection method.

6. The method as claimed in claim 3, wherein in the step of assembling a separation member, the separation plate is fixedly attached onto the separation cut groove for isolating the signal emitting device and the signal detecting device on the same sensor unit area.

7. The method as claimed in claim 3, wherein the packaging structure has a plurality of sides, the sides are fully covered by the side packaging plates of the separation member.

8. The method as claimed in claim 3, wherein the packaging structure has a plurality of sides, at least one of the sides is exposed from the separation member.

9. The method as claimed in claim 1, wherein the signal emitting device and the signal detecting device on the same sensor unit area are respectively mounted on the at least two individual circuit areas by a die-attaching method, and the signal emitting device and the signal detecting device on the same sensor unit area wire-bonded with the corresponding circuit area.

10. The method as claimed in claim 1, wherein the packaging structure is formed by clear materials with transmission of visible lights or by clear materials with transmission of infrared-range radiation.

11. The method as claimed in claim 1, wherein a depth of the separation cut groove is larger than the thickness of the packaging structure so that the substrate is exposed through the separation cut groove in the step of cutting the packaging structure.

12. The method as claimed in claim 1, wherein the substrate further has a plurality of conductive pads, and the signal emitting device and the signal detecting device are electrically connected to the conductive pads.

\* \* \* \* \*